United States Patent [19]
Windsheimer et al.

[11] Patent Number: 6,084,394
[45] Date of Patent: Jul. 4, 2000

[54] ELECTRONIC MEASURING DEVICE USING A CORRECTION FACTOR TO COMPENSATE FOR MEASURING ERRORS

[75] Inventors: Klaus Windsheimer, Spalt; Georg Grimm, Diespeck, both of Germany

[73] Assignee: Siemens Aktiengesellschaft, Munich, Germany

[21] Appl. No.: 09/092,129

[22] Filed: Jun. 5, 1998

Related U.S. Application Data

[63] Continuation of application No. PCT/DE96/02215, Nov. 20, 1996.

[30] Foreign Application Priority Data

Dec. 5, 1995 [DE] Germany .................. 195 45 511

[51] Int. Cl.$^7$ ............. G01R 35/00; G01R 19/25
[52] U.S. Cl. ............. 324/130; 324/132; 324/74; 702/85
[58] Field of Search ............. 324/74, 130, 132, 324/142, 99 D; 702/85, 86, 90, 104, 107; 341/120, 121; 327/72

[56] References Cited

U.S. PATENT DOCUMENTS

| | | | |
|---|---|---|---|
| 3,824,588 | 7/1974 | Vermillion | 324/130 |
| 4,127,811 | 11/1978 | Gookin, Jr. et al. | 324/130 |
| 4,200,933 | 4/1980 | Nickel et al. | 324/130 |
| 4,688,194 | 8/1987 | Shimizu | 702/107 |
| 4,800,513 | 1/1989 | Deutsch | 702/107 |
| 4,837,504 | 6/1989 | Baer et al. | 324/142 |
| 5,122,735 | 6/1992 | Porter et al. | 324/142 |

FOREIGN PATENT DOCUMENTS

| | | |
|---|---|---|
| 0240102A1 | 10/1987 | European Pat. Off. . |
| 0408287A2 | 1/1991 | European Pat. Off. . |
| 2357907 | 2/1978 | France . |
| 2381317 | 9/1978 | France . |
| 86-03301 | 6/1986 | WIPO . |
| 95-10781 | 4/1995 | WIPO . |

*Primary Examiner*—Diep N. Do
*Attorney, Agent, or Firm*—Herbert L. Lerner; Laurence A. Greenberg; Werner H. Stemer

[57] ABSTRACT

An electronic measuring device achieves an improvement in measurement accuracy while at the same time compensating for influences on the measurements, by providing for a correction factor to be stored in a correction element when the measuring device is first set up. During operation, provision is made for a test voltage to be received and compared with a reference value stored during setting. If there is a difference between the two values, a new correction factor is produced which compensates for any measurement signal effect. The measuring device is particularly suitable for electricity meters.

5 Claims, 1 Drawing Sheet

ELECTRONIC MEASURING DEVICE USING A CORRECTION FACTOR TO COMPENSATE FOR MEASURING ERRORS

CROSS-REFERENCE TO RELATED APPLICATION

This application is a continuation of International Application No. PCT/DE96/02215, filed Nov. 20, 1996, which designated the United States.

BACKGROUND OF THE INVENTION

1. Field of the Invention

The invention relates to an electronic measuring device, in particular a meter, including at least one A/D converter receiving measurement signals, and a digital signal processing device connected downstream of the A/D converter, the signal processing device having a correction element with a first stored reference value and a resulting first correction factor for compensating for any measurement error in an upstream signal detection, the A/D converter can receive a test voltage as a measurement signal, and the correction element can produce a new correction factor when there is a difference between the reference value and the value of the test voltage.

Such a measuring device is disclosed in German Published, Non-Prosecuted Patent Application DE 26 30 959 A1, corresponding to Published French Patent Application 2 357 907.

International Patent Publication WO 95/10781 discloses an electronic measuring device in which digitized measurement signals are monitored for a measurement error. If a measurement error occurs, a correction pulse is produced, so that the measurement error is compensated for. That measuring device is preferably used for measuring consumption, in particular for a meter.

If an A/D converter is used for such an electronic measuring device, the converter generally requires a reference voltage source. That is also the case if a sigma-delta modulator ($\Sigma\Delta$ modulator) is used. The reference voltage must meet high requirements, since the accuracy of the measuring device is directly dependent on the reference voltage. High measurement accuracy therefore also requires a precise reference voltage, which is very complicated to produce, and it is not necessarily possible to ensure operational reliability.

2. Summary of the Invention

It is accordingly an object of the invention to provide an electronic measuring device, which overcomes the hereinafore-mentioned disadvantages of the heretofore-known devices of this general type and which exhibits high measurement accuracy while at the same time compensating for influences on the measurements.

With the foregoing and other objects in view there is provided, in accordance with the invention, an electronic measuring device, comprising at least one A/D converter for receiving measurement signals including a test voltage having a value; a reference voltage source connected to the at least one A/D converter for operation; and a digital signal processing device connected downstream of the at least one A/D converter; the signal processing device having a correction element with a first stored reference value and a resulting first correction factor for compensating for any measurement error in an upstream signal detection, the correction element producing a new correction factor when a difference exists between the first reference value and the value of the test voltage, and the new correction factor is the first correction factor corrected corresponding to or on the basis of the difference, or it is an additional correction factor.

In this manner, the entire measurement path for signal detection is based on the test voltage. This means that, for example, systematic errors, in particular the temperature response of the A/D converter or an effect of an upstream multiplexer, are detected and compensated for. This produces dynamic measurement error compensation, as it were.

It is advantageous if the first correction factor adapted or corrected on the basis of the difference is used as the new correction factor. This makes simple dynamic adaptation of the correction factor possible. If necessary, the original value can also be saved in a further memory as a precaution.

As an alternative to this, an additional correction factor can be used as the new correction factor. This enables the original setting and the dynamic or instantaneous factor to be separated. The separate correction factor is responsible for dynamic adaptation during operation.

In accordance with another feature of the invention, there is provided a device for cyclically checking the difference or producing the new correction factor. This means that the measurement accuracy is continuously checked and adapted with respect to a changed reference voltage or other influences on the measurements. In this case, the cycle times can be prescribed depending on the measurement accuracy desired.

In accordance with a further feature of the invention, the measurement signals are current and voltage signals, and the signal processing device includes a device for metering electrical power consumption. This constitutes a preferred application of the invention. The measuring device is then used as a meter.

In accordance with an added feature of the invention, the A/D converter has a sigma-delta modulator ($\Sigma\Delta$ modulator). This produces favorable interaction in terms of a precise processing of measured values.

In accordance with a concomitant feature of the invention, the signal processing device produces an error signal whenever the difference exceeds a prescribed limit value. This provides additional error monitoring.

Other features which are considered as characteristic for the invention are set forth in the appended claims.

Although the invention is illustrated and described herein as embodied in an electronic measuring device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is a block circuit diagram of an exemplary embodiment of an electronic measuring device according to the invention.

DESCRIPTION OF THE PREFERRED EMBODIMENTS

Figure 1:
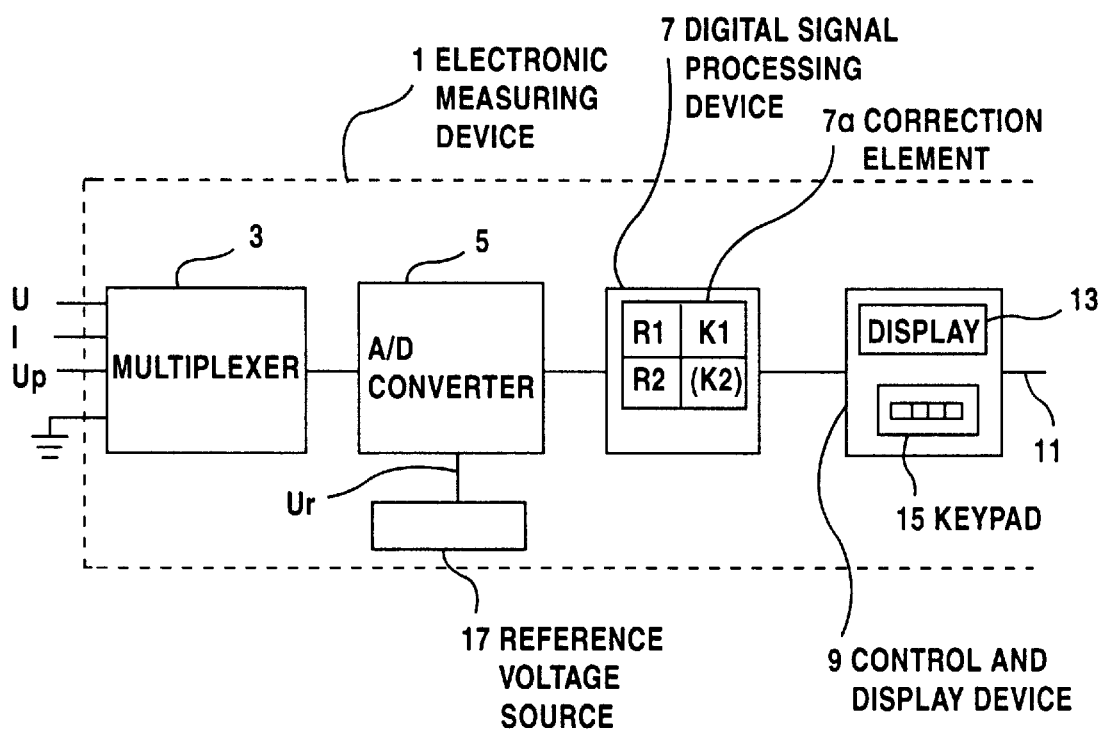

Referring now in detail to the single FIGURE of the drawing, there is seen an electronic measuring device 1 which is preferably used as a meter for electrical power. In principle, the measuring device can also be used for other applications, e.g. for temperature detection and processing, in which an analog signal is to be processed digitally.

In order to provide signal detection and processing, the measuring device 1 includes a series circuit having a multiplexer 3, an A/D converter 5 connected downstream of the latter and a subsequent digital signal processing device, which is merely referred to below as a device 7. The device 7 preferably has a microcomputer and/or a digital signal processor for signal processing. All signal processing is therefore carried out with the aid of programs or program modules which may, if appropriate, also be used twice for different functions.

The device 7 has a control and display device 9 connected thereto. The device 9 has, for example, a display device or display 13, a keypad 15 and/or an interface 11. This provides a comprehensive data input and output facility for the measuring device 1.

Signal detection involves initially feeding measurement signals, in particular a voltage U and a current I, to the measuring device 1, and feeding them through the multiplexer 3 to the A/D converter 5 for digitization.

This signal detection can, of course, also be constructed to be multichannel, e.g. for detecting multiphase voltages and currents or for detecting current and voltage separately. In such a case, a number of multiplexers and/or A/D converters might then be connected to the device 7 as appropriate.

The A/D converter 5 requires a reference voltage Ur, which is a DC voltage, for it to operate. This reference voltage is supplied to the A/D converter from a reference voltage source 17. If the device 1 is constructed as a module or a semiconductor component, it is possible, for example, to produce the reference voltage input of the A/D converter 5 and the output of the reference voltage source 17 separately and, if appropriate, to connect them to one another externally using a bridge. This makes it possible to perform checking operations, wherein a voltage from an external voltage source can then also be supplied to the A/D converter 5. The reference voltage source 17 is preferably a constituent part of the device 1.

The device 7 has a correction element 7a. A first correction factor K1, which corresponds to a first stored reference value R1, is saved in a memory of the correction element 7a. In addition, the correction factor K1 may already contain further multiplication factors or other factors for the purpose of (computational) simplification.

In order to set or save the reference value R1 for the first time, such as when it is set or adjusted in the factory for the first time, one input of the multiplexer 3 is initially connected, for example, to ground (indicated by the ground symbol in the FIGURE) and the resulting digitized voltage value is initially stored. This value corresponds to the DC component of the signal detection. The input which is used for this purpose may be a special input or an input which is used for current or voltage.

In addition, a highly accurate test signal Up (a test voltage used as a new reference or a new base) is applied to another input of the multiplexer 3. The resulting difference value between the voltage value of the DC component and the measured value of the test signal Up corresponds to the actual value of the test signal Up. This value is stored as the first reference value R1, thereby producing the resulting correction factor K1 for all other digitized measured values.

During operation of the measuring device 1, a further comparison with a test signal Up is preferably carried out at cyclic intervals (which can be prescribed manually or automatically). This can be produced by the same voltage transmitter or, for example, by a voltage transmitter installed at the location where the device 1 is installed. The time intervals of the cycles can be prescribed as per requirements. The corresponding digitized value is stored as a second new reference value R2. Subsequently, a comparison is made between the first reference value R1 and the second reference value R2. If they are different, a new correction factor is determined.

This can be carried out in such a way that, for example, the first correction factor K1 is formed again or is overwritten, or a completely new and separate correction factor K2 is placed in a further memory which is then used for operation at that time. This makes it possible to identify changes in the detected measured values, so that the measurement accuracy can be continuously adapted and maintained. The correction factor K2 can be equal to the correction factor K1 for the first basic setting, or it may have a default value, for example 1.

Should the difference between the values R1 and R2 exceed a prescribed limit value, it is possible for the device 7 to produce an error signal which will then be signaled through the control and display device 9 or through the interface 11 to a superordinate central control station. The error signal is then an indication that there is a significant measurement error.

The measuring device 1 is particularly suitable for use as a precision meter for class 0.5 or 0.2. In this instance, the test signal Up fed to the measuring device 1 must be highly accurate and satisfy the appropriate calibration or standardization requirements.

The measuring device shown has the advantage of ensuring that the entire signal detection process or the measuring system is based on the external test signal, in particular its reference voltage. This obviates systematic errors, such as the effect of temperature on the multiplexer 5 or on the switch resistance when a sigma-delta modulator is used.

Of course, if the measuring device is used as a meter, the relevant regulations with regard to standardization etc. have to be taken into account. A particular application is conceivable, for example, for detecting consumption without any bearing on billing, e.g. in a company. The test signal Up can be permanently connected to an input, for example. The test signal source which is necessary therefor can be incorporated in the measuring device 1 or be connected externally. Alternatively, it is also possible to make temporary connections or connections which are repeated at specifiable intervals.

We claim:

1. An electronic measuring device, comprising:

at least one A/D converter for receiving measurement signals including a test voltage having a value;

a reference voltage source connected to said at least one A/D converter for operation; and a digital signal processing device connected downstream of said at least one A/D converter;

said signal processing device having a correction element with a first stored reference value and a resulting first correction factor for compensating for a measurement error in an upstream signal detection, said correction element producing a new correction factor when a difference exists between the first reference value and the value of the test voltage, and the new correction factor is one of the first correction factor corrected corresponding to the difference, and an additional correction factor.

2. The electronic measuring device according to claim 1, including a device for cyclically checking the difference.

3. The electronic measuring device according to claim 1, wherein said at least one A/D converter receives current and voltage signals as the measurement signals, and said signal processing device includes a device for metering electrical power consumption.

4. The electronic measuring device according to claim 1, wherein said at least one A/D converter includes a sigma-delta modulator.

5. The electronic measuring device according to claim 1, wherein said signal processing device presents an error signal whenever the difference exceeds a prescribed limit value.

* * * * *